(12) United States Patent
Sakurai et al.

(10) Patent No.: US 6,586,962 B2
(45) Date of Patent: Jul. 1, 2003

(54) SEMICONDUCTOR DEVICE

(75) Inventors: Akinori Sakurai, Tokyo (JP); Hiromichi Nogawa, Yamagata (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/988,778

(22) Filed: Nov. 20, 2001

(65) Prior Publication Data

US 2002/0060328 A1 May 23, 2002

(30) Foreign Application Priority Data

Nov. 22, 2000 (JP) ....................................... 2000-355696

(51) Int. Cl.$^7$ ............................................. H03K 19/00
(52) U.S. Cl. ................................. 326/16; 326/9; 326/37
(58) Field of Search ................... 326/16, 9, 37, 326/38

(56) References Cited

U.S. PATENT DOCUMENTS 6,057,691 A * 5/2000 Kobayashi .................. 324/617
6,069,849 A * 5/2000 Kingsley et al. ............ 368/113
6,246,274 B1 * 6/2001 Sakai et al. .................. 327/270

* cited by examiner

Primary Examiner—Michael Tokar
Assistant Examiner—Anh Q. Tran
(74) Attorney, Agent, or Firm—Foley & Lardner

(57) ABSTRACT

The semiconductor device according to the present invention includes a semiconductor chip having a delay unit and a delay time measuring unit for measuring a delay time. The delay time measuring unit generates a measurement result signal, which is a digital signal, based on the delay time, and outputs the measurement result signal outside the semiconductor chip.

5 Claims, 9 Drawing Sheets

US 6,586,962 B2

SEMICONDUCTOR DEVICE

BACKGROUND OF THE INVENTION

1. Field of the Invention

The present invention relates to a semiconductor device, and more specifically to a semiconductor device including a delay device.

2. Description of the Prior Art

A semiconductor device loaded with a delay device has been widely used. In the semiconductor device, a delay time of the delay device can perform an important function in the operations of the semiconductor device. Therefore, to guarantee the functions of the semiconductor device, it is necessary to test the delay time of the delay device. Conventionally, in this case, a measuring device for measuring the delay time externally for the semiconductor device is connected to the delay device to measure the delay time.

FIG. 9 shows the configuration of a conventional semiconductor device 100 loaded with a delay device and the configuration of a measuring device 200 for measuring the delay time of the delay device. The conventional semiconductor device 100 includes an internal circuit 101, a multiplexer 102, a delay device 103, an input buffer 104, and an output buffer 105. The input buffer 104 is used to input a signal into the semiconductor device 100 from a device external to the semiconductor device 100. The output buffer 105 is used to output a signal from the semiconductor device 100 to a device external to the semiconductor device 100.

The internal circuit 101 is connected to the first input line of the multiplexer 102. The second input line of the multiplexer 102 is connected to the output line of the input buffer 104. The multiplexer 102 selectively connects either internal circuit 101 or input buffer 104 to the delay device 103. The delay device 103 is connected to the input lines of the internal circuit 101 and the output buffer 105.

The measuring device 200 includes a control circuit 201, a trigger pulse generation circuit 202, and a delay time identification circuit 203. The control circuit 201 controls the entire measuring device 200. The trigger pulse generation circuit 202 inputs a test input signal TIN into the semiconductor device 100. The delay time identification circuit 203 identifies a delay time of the delay device 103 loaded into the semiconductor device 100 from the test output signal TOUT output from the semiconductor device 100.

When the semiconductor device 100 operates normal operations, the multiplexer 102 connects the delay device 103 to the internal circuit 101. The internal circuit 101 inputs an input signal IN into the delay device 103 through the multiplexer 102. The delay device 103 generates an output signal OUT by delaying the input signal IN, and outputs it to the internal circuit 101.

When the delay time of the delay device 103 is measured, the measuring device 200 is connected to the semiconductor device 100. Then, the multiplexer 102 connects the delay device 103 to the input buffer 104.

The test input signal TIN that is output by a trigger pulse generation circuit 202 is input into the delay device 103 through the input buffer 104 and the multiplexer 102. The delay device 103 outputs the test output signal TOUT by delaying the test input signal TIN. The test output signal TOUT is output to the delay time identification circuit 203 through the output buffer 105. The time τ required from the input of the test input signal TIN into the semiconductor device 100 to the output of the test output signal TOUT from the semiconductor device 100 is obtained by adding up the delay times of the input buffer 104, the multiplexer 102, the delay device 103, and the output buffer 105. The delay time identification circuit 203 identifies the delay time of the delay device 103 by subtracting the delay times occurring in the input buffer 104 and the output buffer 105 from the required time τ.

However, it is not desired to input the test input signal TIN into the delay device 103 through the input buffer 104 with a view to improving the measurement precision of the delay time of the delay device 103. Similarly, it is not desired to output the test output signal TOUT from the delay device 103 through the output buffer 105 with a view to improving the measurement precision of the delay time of the delay device 103. The main reasons are described below.

The input buffer 104 and the output buffer 105 connected to devices external to the semiconductor device cannot be reduced in size to protect the semiconductor device against the electrostatic destruction by static electricity which can be externally applied. Therefore, the delay times occurring in the input buffer 104 and the output buffer 105 are necessarily long to a certain extent. To be more practical, the delay times occurring in the input buffer 104 and the output buffer 105 are normally longer than 1 ns. Since the delay times occurring in the input buffer 104 and the output buffer 105 depend on various production conditions, it is difficult to make the measurement error of the delay time of the delay device 103 smaller than the delay times occurring in the input buffer 104 and the output buffer 105.

It is desired that the delay time of the delay device loaded into the semiconductor device is more correctly measured.

BRIEF SUMMARY OF THE INVENTION

Object of the Invention

The present invention aims at providing a semiconductor device which is loaded with a delay device and is capable of more correctly measuring the delay time of the delay device.

Summary of the Invention

The semiconductor device according to the present invention is provided with a semiconductor chip including a delay unit having a delay time and a delay time measuring unit for measuring a delay time. The delay time measuring unit generates a measurement result signal, that is, a digital signal, based on the delay time, and outputs the measurement result signal outside the semiconductor chip.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

The semiconductor device according to the first embodiment of the present invention is described below by referring to the attached drawings.

Figure 1:
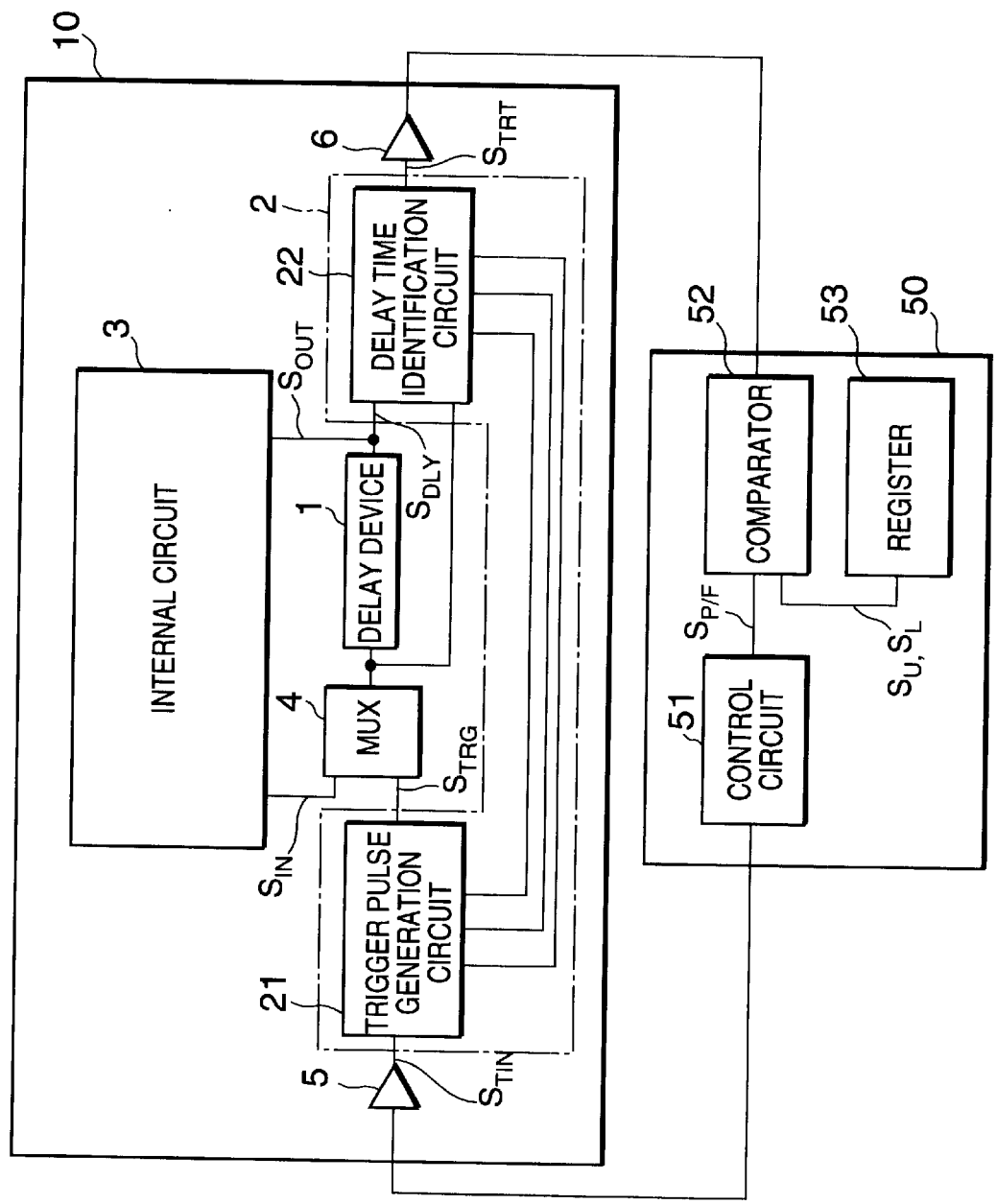
FIG. 1 shows the configurations of the semiconductor device and a tester 50 for measuring the delay time of a delay device 1 loaded into the semiconductor device according to the first embodiment of the present invention.

FIG. 1 shows the semiconductor device according to the first embodiment of the present invention. The semiconductor device includes the semiconductor chip 10. The delay device 1, a delay time measurement circuit 2, an internal circuit 3, a multiplexer 4, an input buffer 5, and an output buffer 6 are loaded into the semiconductor chip 10. The semiconductor device has two operation modes, that is, a delay time measurement mode and a normal operation mode.

The delay device 1 delays a signal input into it by a predetermined delay time, and then outputs the resultant signal.

When the semiconductor device enters the delay time measurement mode, the delay time measurement circuit 2 measures the delay time of the delay device 1. The delay time measurement circuit 2 includes a trigger pulse generation circuit 21 and the delay time identification circuit 22. In response to a test instruction signal STIN, the trigger pulse generation circuit 21 outputs a test trigger signal STRG to the delay time measurement circuit 2. The test instruction signal STIN instructs the trigger pulse generation circuit 21 to output the test trigger signal STRG. The test instruction signal STIN is input into the semiconductor chip 10 from outside through the input buffer 5. The delay time identification circuit 22 measures the delay time of the delay device 1 according to the test trigger signal STRG and a test output signal SDLY generated by delaying the test trigger signal STRG by the delay device 1. The delay time identification circuit 22 outputs a test result signal STRT indicating the measured delay time of the delay device 1. The test result signal STRT is a digital signal. The test result signal STRT is output outside the semiconductor chip 10 through the output buffer 6.

When the semiconductor device enters the normal operation mode, the internal circuit 3 functions using the delay device 1. The internal circuit 3 inputs an input signal SIN into the delay device 1 when the semiconductor device enters the normal operation mode. The internal circuit 3 performs a predetermined operation according to an output signal SOUT generated by the delay time measurement circuit 2 delaying the input signal SIN.

The multiplexer 4 selectively connects either delay time measurement circuit 2 or internal circuit 3 to the delay device 1. When the semiconductor device enters the delay time measurement mode, the multiplexer 4 connects the delay device 1 to the delay time measurement circuit 2. When the semiconductor device enters the normal operation mode, the multiplexer 4 connects the delay device 1 to the internal circuit 3.

When the delay time of the delay device 1 is measured, the tester 50 is connected to the semiconductor chip 10. The tester 50 includes a control circuit 51, a comparator 52, and a register 53.

The control circuit 51 is connected to the input buffer when the tester 50 is connected to the semiconductor chip 10. The control circuit 51 provides the test instruction signal STIN for the trigger pulse generation circuit 21 through the input buffer 5.

The comparator 52 is connected to the output buffer 6 when the tester 50 is connected to the semiconductor chip 10. The comparator 52 receives the test result signal STRT output by the delay time identification circuit 22 through the output buffer 6. The comparator 52 recognizes the measured delay time of the delay device 1 according to the test result signal STRT. The comparator 52 is further connected to the register 53. The register 53 holds an upper limit value SU and a lower limit value SL of the delay time to be held by the delay device 1. The comparator 52 determines whether or not the measured delay time is in the range of the upper limit value SU to the lower limit value SL. The comparator 52 outputs a determination result signal SP/F indicating a determination result, and outputs it to the control circuit 51.

At this time, the measurement precision of the delay time of the delay device 1 is not subject to the influence of the delay times occurring in the input buffer 5 and the output buffer 6 because the semiconductor device includes the delay device 1 and the delay time measurement circuit 2 for measuring the delay time of the delay device 1 loaded into the semiconductor chip 10. The delay time measurement circuit 2 measures the delay time of the delay device 1, and outputs the test result signal STRT indicating the measured delay time outside the semiconductor chip 10. At this time, the test trigger signal STRG for measurement of the delay device 1 and the test output signal SDLY do not pass through the input buffer 5 and the output buffer 6. Therefore, the measured delay time has no influence of the delay times occurring in the input buffer 5 and the output buffer 6.

Figure 2:
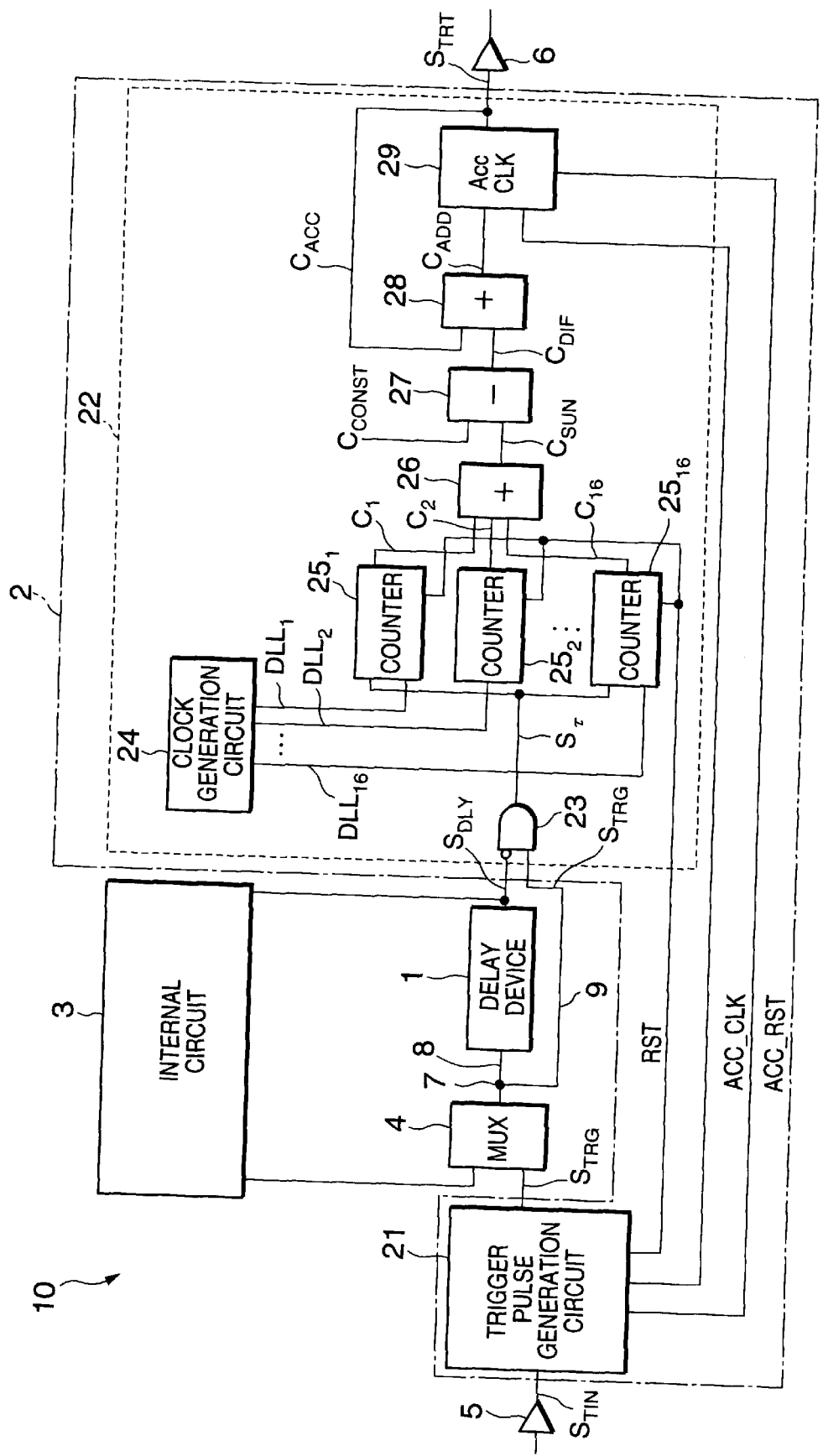
FIG. 2 shows the configuration of a semiconductor chip 10.

FIG. 2 shows in detail the configuration of the semiconductor chip 10. As described above, the delay time measurement circuit 2 includes the trigger pulse generation circuit 21 and the delay time identification circuit 22.

The trigger pulse generation circuit 21 provides a reset signal RST, an accumulator reset signal ACC_RST, and a clock signal ACC_CLK for the delay time identification circuit 22. The reset signal RST, the accumulator reset signal ACC_RST, and the clock signal ACC_CLK control the operation of the delay time identification circuit 22.

In response to the test instruction signal STIN, the trigger pulse generation circuit 21 generates the test trigger signal STRG. The trigger pulse generation circuit 21 changes the test trigger signal STRG from an L level to an H level at an instruction of the test instruction signal STIN. The test trigger signal STRG reaches a node 7 through the multiplexer 4. A signal line 8 is connected to the node 7. The test trigger signal STRG is input into the delay device 1 through the signal line 8. The delay device 1 outputs the test output signal SDLY to the delay time identification circuit 22 by delaying the test trigger signal STRG. After the test trigger signal STRG changes from the L level to the H level, the test output signal SDLY changes from the L level to the H level with a delay by the delay time of the delay device 1. A signal line 9 is also connected to the node 7. The test trigger signal STRG is input into the delay time identification circuit 22 through the signal line 9.

The delay time identification circuit 22 measures the delay time of the delay device 1 according to the test trigger signal STRG and the test output signal SDLY. The delay time identification circuit 22 includes an AND gate 23, a clock generation circuit 24, counters 251 to 2516, a first adder 26, a subtracter 27, a second adder 28, and an accumulator 29.

The above mentioned test trigger signal STRG and test output signal SDLY are input into the AND gate 23 contained in the delay time identification circuit 22. The AND gate 23 obtains a logical product of the test trigger signal STRG and an inverted signal of the test output signal SDLY and outputs a delay time signal Sτ. The delay time signal Sτ is maintained at the H level for a time practically equal to the delay time of the delay device 1.

The clock generation circuit 24 generates clock signals DLL1 to DLL16. The clock signals DLL1 to DLL16 have the same periods T, but different phases. In the clock signals DLL1 to DLL16, the clock signal DLLi is obtained by delaying the clock signal DLL1 by a time $(T/16) \times (i-1)$, where i indicates an integer in the range of 1 to 16. The clock generation circuit 24 can be a clock generator described in, for example, the Patent Publication (No. 2990171). The clock signals DLL1 to DLL16 generated by the clock generation circuit 24 are provided respectively for the counters 251 to 2516.

The counters 251 to 2516 respectively hold counter values C1 to C16. A delay time signal Sτ generated by the AND gate 23 is input into each of the counters 251 to 2516. The counter 251 in the counters 251 to 2516 increases a counter value C1 by 1 each time the clock signal DLL1 is set while the delay time signal Sτ is at the H level. The counter 252 increases a counter value C2 by 1 each time the clock signal DLL2 is set while the delay time signal Sτ is at the H level. Similarly, the counter 25$i$ in the counters 251 to 2516 increases a counter value Ci each time the clock signal DLLi is set while the delay time signal Sτ is at the H level, where i indicates an integer in the range of 1 to 16. A reset signal RST generated by the trigger pulse generation circuit 21 is input into the counters 251 to 2516. When the reset signal RST enters the H level, the counters 251 to 2516 contained in the delay time identification circuit 22 are reset, and the counter values C1 to C16 are set to 0.

Providing the plurality of counters 251 to 2516 for the delay time identification circuit 22 contributes the improvement of the resolution of the measurement of the delay time. Assuming that the period of the clock signals DLL1 to DLL16 is T, and the number of the counters 251 to 2516 is n, the resolution of the measurement of the delay time is T/n. As in the present embodiment, the resolution of the measurement can be improved by providing a plurality of counters, that is, by setting n to 2 or more.

The first adder 26 adds up the counter values C1 to C16 held by the counters 251 to 2516, and computes the counter value sum CSUM. The counter value sum CSUM is computed once each time the test trigger signal STRG enters the H level. The counter value sum CSUM is generally proportional to the delay time of the delay device 1, and indicates the delay time of the delay device 1. Computing of the counter value sum CSUM is equivalent to measuring of the delay time of the delay device 1.

However, the counter value sum CSUM can be uncertain to some extent due to the timing of the test trigger signal STRG entering the H level from the L level, and the timing of the clock signals DLL1 to DLL16 entering the H level from the L level. Then, the counter value sum CSUM is computed N times, and an average value is obtained for use in computing the delay time of the delay device 1, thereby improving the measurement precision. An average counter value sum C^SUM which is an average value of the counter value sum CSUM is represented as follows.

$$C\hat{}SUM = \Sigma CSUM/N$$

To obtain an average value of the counter value sum CSUM computed predetermined plural times, it is necessary to compute the sum ΣCSUM of the counter value sum CSUM computed predetermined plural times. At this time, it is desired that the smallest possible number of bits is required to compute the sum ΣCSUM.

It is considered that the counter value sum CSUM indicating the delay time of the delay device 1 is distributed in a range centering on a constant value CCONST. The delay time identification circuit 22 uses the difference CDIF obtained by subtracting the constant value CCONST from the counter value sum CSUM to obtain the sum of the counter value sum CSUM, thereby reducing the number of necessary bits. With the purpose, the delay time identification circuit 22 is provided with the subtracter 27, the second adder 28, and the accumulator 29.

The above mentioned counter value sum CSUM is input into the subtracter 27. The subtracter 27 subtracts the constant value CCONST from the counter value sum CSUM, thereby obtaining the difference CDIF. The difference CDIF is computed each time the delay time of the delay device 1 is measured to compute the counter value sum CSUM.

On the other hand, the accumulator 29 holds an accumulation value CACC. The second adder 28 computes a sum CADD by adding up the difference CDIF and the accumulation value CACC, and outputs the sum to the accumulator 29.

A clock signal ACC_CLK is input into the accumulator 29. The clock signal ACC_CLK enters the H level from the L level each time the delay time of the delay device 1 is measured, and the counter value sum CSUM is computed. The accumulator 29 fetches the sum CADD each time the clock signal ACC_CLK enters the H level from the L level. The accumulator 29 defines the fetched sum CADD as an accumulation value CACC held by the accumulator 29. The accumulation value CACC is a sum of the computed differences CDIF. Assume that the delay time of the delay device 1 is measured predetermined N times, and the sum of the computed differences CDIF is defined as the accumulation value CACCN. The accumulation value CACCN is output to the tester 50 through the output buffer 6 according to the test result signal STRT.

An accumulator reset signal ACC_RST is further input into the accumulator 29. When the accumulator reset signal ACC_RST enters the H level, the accumulator 29 returns to 0 the accumulation value CACC held by the accumulator 29. When the delay time of the delay device 1 is measured predetermined N times, and the accumulation value CACCN is output to the tester 50, the accumulator reset signal ACC_RST is set at the H level, and the accumulation value CACC is returned to 0.

The accumulation value CACCN output by the accumulator 29 is transmitted to the comparator 52 of the tester 50 according to the test result signal STRT. The comparator 52 inversely computes the sum ΣCSUM from the accumulation value CACCN transmitted by the test result signal STRT as described below.

$$\Sigma CSUM = n \cdot CCONST + CACCN$$

An average value C^SUM of the counter value sum CSUM can be computed by the following equation.

$$C\hat{}SUM = \Sigma CSUM/N$$

The comparator 52 recognizes a measured delay time τ of the measured delay device 1 through the average value C^SUM. The comparator 52 determines whether or not the measured delay time τ is in the range of the lower limit value SL to the upper limit value SU, and satisfies the standards.

Figure 3:
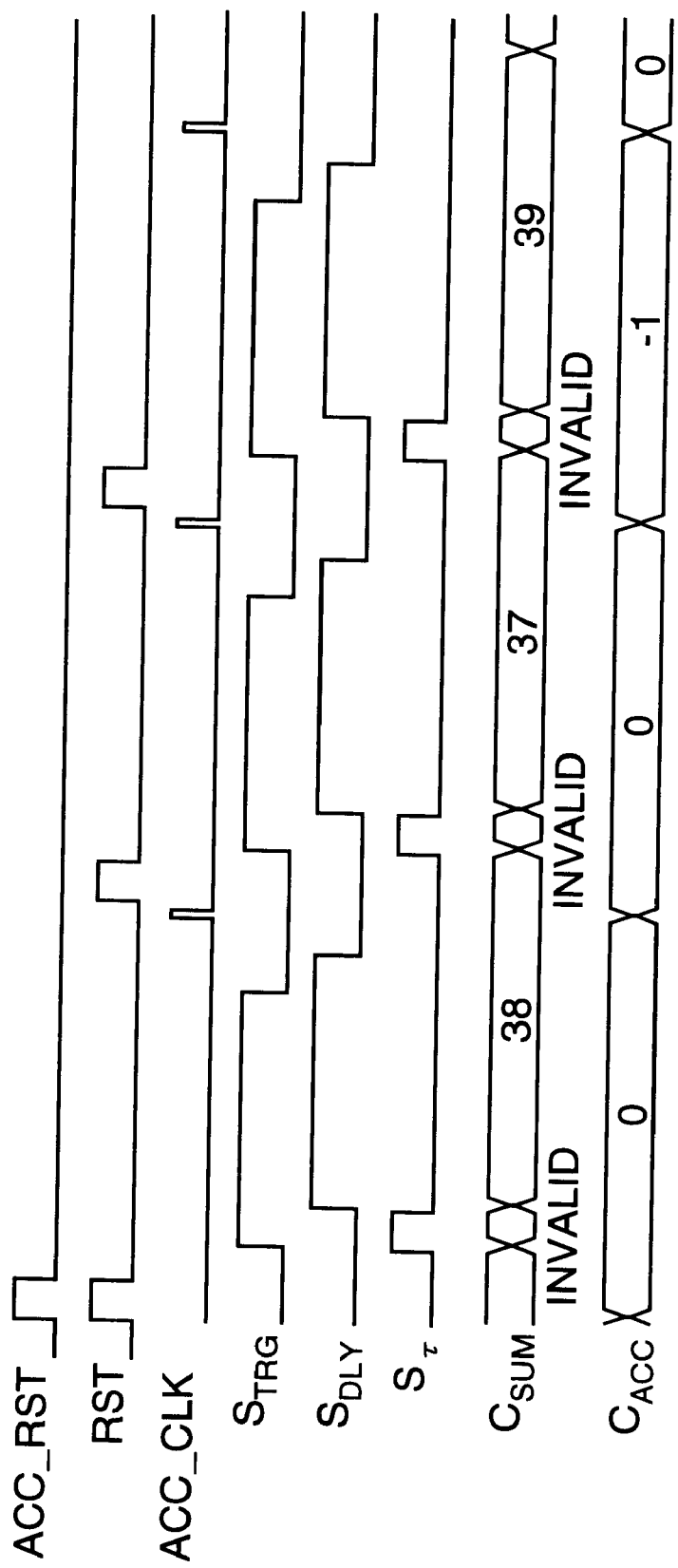
FIG. 3 shows the operation of a delay time identification circuit 22.

FIG. 3 shows the process of computing the above mentioned accumulation value CACCN by the delay time identification circuit 22. According to the present embodiment, the delay time of the delay device 1 is measured three times. That is, the accumulation value CACCN is held by the accumulator 29 after measuring the delay time of the delay device 1 three times. Furthermore, the constant value CCONST is assumed to be 38.

First, the accumulator reset signal ACC_RST is set at the H level, and the accumulation value CACC held by the accumulator 29 is set to 0.

Then, the first measurement of the delay time of the delay device 1 is taken. First, the reset signal RST is set at the H level, and the counter values C1 to C16 held by the counters 251 to 2516 are set to 0. Then, the trigger pulse generation circuit 21 allows the test trigger signal STRG to enter the H level from the L level. The test trigger signal STRG is delayed by the delay device 1, and the test output signal SDLY is generated. The counter value sum CSUM is computed according to the test trigger signal STRG and the test output signal SDLY.

Figure 4:
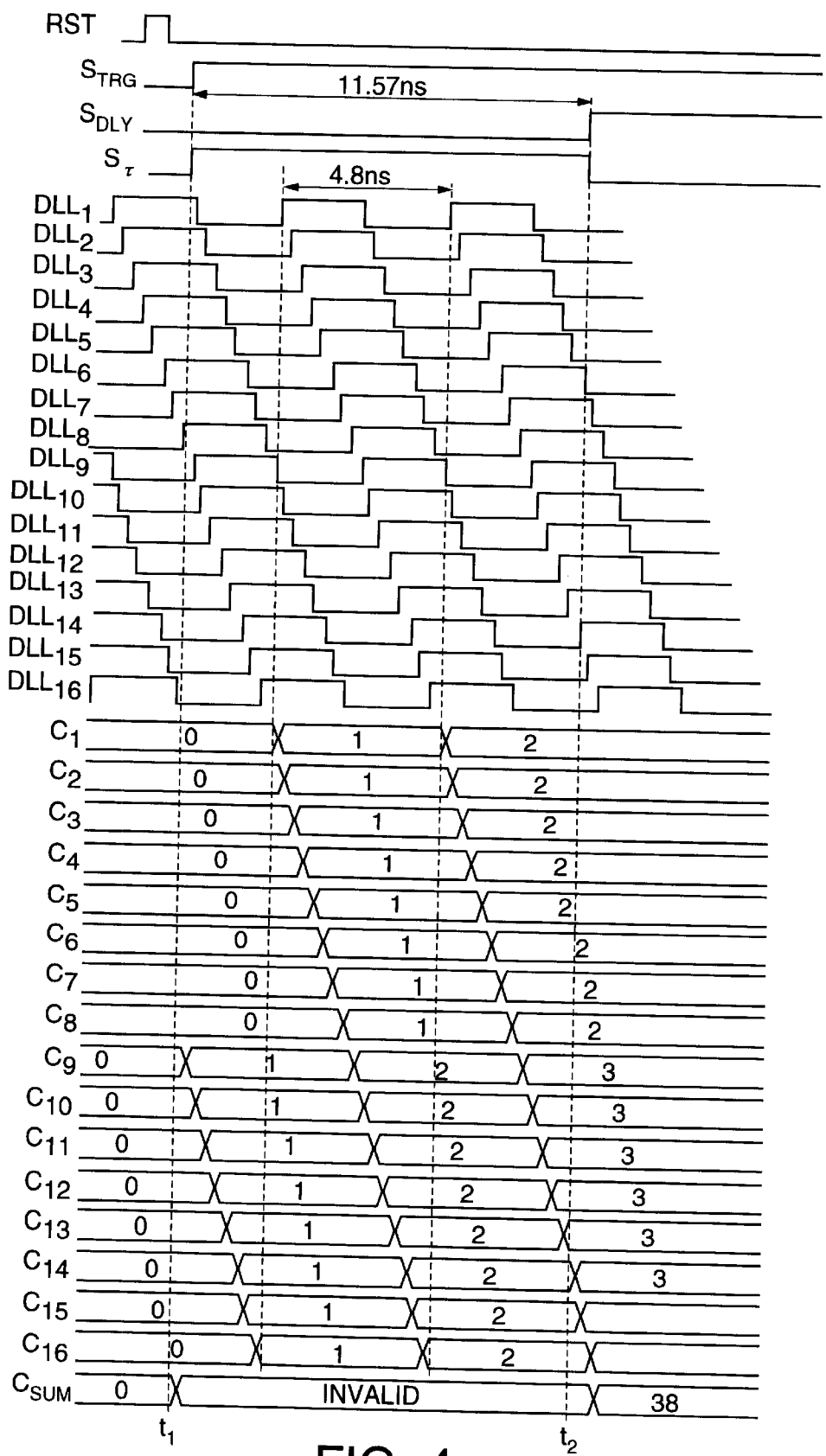
FIG. 4 shows the process of generating a counter value sum CSUM.

FIG. 4 shows the process of computing the counter value sum CSUM according to the test trigger signal STRG and the test output signal SDLY. In FIG. 4, it is assumed that the test trigger signal STRG enters the H level from the L level at the time t1. Furthermore, the period T of the clock signals DLL1 to DLL16 is assumed to be 4.8 ns. The test output signal SDLY is changed from the L level to the H level at the time t2 later than the test trigger signal STRG by the delay time tDLY of the delay device 1.

$$tDLY = t2 - t1$$

In FIG. 4, the time tDLY is assumed to be 11.57 ns. The delay time signal Sτ, which is a logical product of the test trigger signal STRG and the inverse signal of the test output signal SDLY, enters the H level from the time t1 to the time t2.

While the delay time signal Sτ is at the H level, the counters 251 to 2516 respectively increase the counter values C1 to C16 by 1 each time the clock signals DLL1 to DLL16 enter the H level from the L level. In the clock signals DLL1 to DLL16, the clock signal DLL9 is the first to enter the H level from the L level after the time t1. When the clock signal DLL9 enters the H level, the counter 259 increases the counter value C9 by 1. Thus, the counter value C9 is 1. Then, the clock signals DDL10 to DDL16 sequentially enter the H level, and each of the counter values C10 to C16 is increased by 1. Similarly, the counter values C1 to C16 are increased while the delay time signal Sτ is the H level.

At the time t2, the delay time signal Sτ enters the L level from the H level, and the counter values C1 to C16 stop increasing. The counter values C1 to C16 are added up, and the counter value sum CSUM is computed. The counter value sum CSUM is output as 38.

As described above, the constant value CCONST is subtracted from the counter value sum CSUM, and the difference CDIF is computed. As described above, according to the present embodiment, the CCONST is 38. The difference CDIF is output as 0.

After computing the difference CDIF, as shown in FIG. 3, the clock signal ACC_CLK enters the H level. The accumulator 29 outputs a new accumulation value CACC as a result of adding up the accumulation value CACC held in the accumulator 29 and the difference CDIF. The accumulation value CACC is 0.

Similarly, the second and third measurements are made on the delay device 1. In the second measurement, the CSUM is 37. The difference CDIF is output as −1, and the accumulation value CACC is −1. In the third measurement, the CSUM is 39. The difference CDIF is 1. The accumulation value CACC held before the third measurement, that is, −1, is added to the difference CDIF computed in the third measurement, that is, 1. Thus, the accumulation value CACCN is output as 0. The accumulation value CACCN is transmitted to the comparator 52 of the tester 50 according to the test result signal STRT. The comparator 52 determines based on the accumulation value CACCN whether or not the delay time of the delay device 1 of the semiconductor chip 10 is in the range of a predetermined standard.

As described above, the counter values C1 to C16 are generated by being sequentially increased by 1 from 0 in the semiconductor device of the present embodiment. However, if the counter values C1 to C16 are generated by monotonously increased or decreased from a certain value, the counter value sum CSUM which is a sum of the counter values C1 to C16 obviously indicates the delay time of the delay device 1.

According to the present embodiment, although the subtracter 27 is provided to subtract a constant value from the counter value sum CSUM, the subtracter 27 can be omitted. In this case, the difference CDIF matches the counter value sum CSUM. However, as described above, with a view to reducing the number of bits of the accumulation value CACC, it is desired that the delay time identification circuit 22 has the configuration including the subtracter 27.

Figure 5:
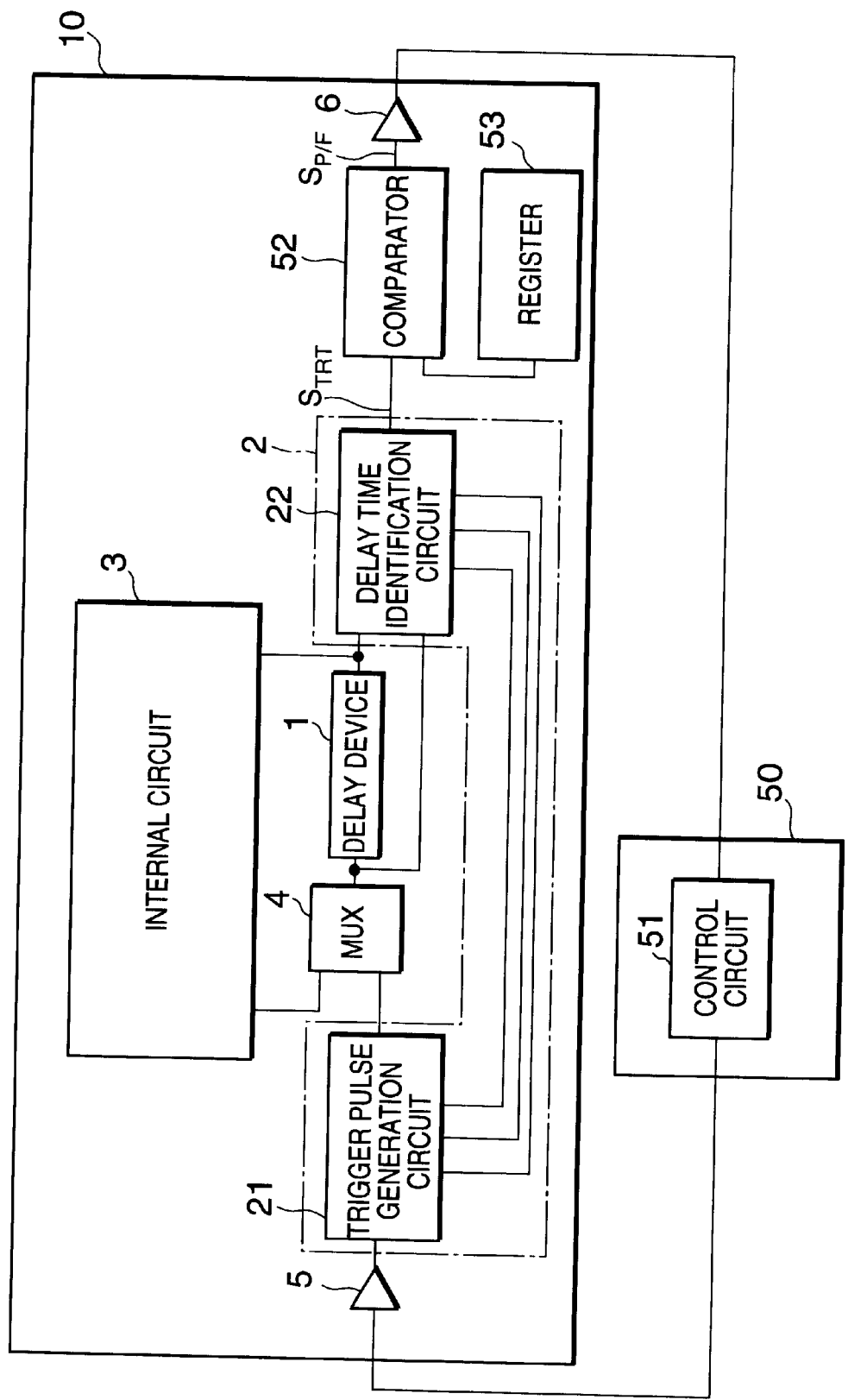
FIG. 5 shows another configuration of the semiconductor device according to the first embodiment of the present invention.

Furthermore, in the present embodiment, as shown in FIG. 5, it is possible to load the semiconductor chip 10 with the comparator 52 and the register 53. In this case, the test result signal STRT can be replaced with the determination result signal SP/F indicating whether or not the delay time of the delay device 1 is in a predetermined range, and the determination result signal SP/F is output to the tester 50. At this time, it is desired that the register 53 is rewritable. Since the register 53 is rewritable, the upper limit value SU and the lower limit value SL in a predetermined standard can be changed as necessary.

Figure 6:
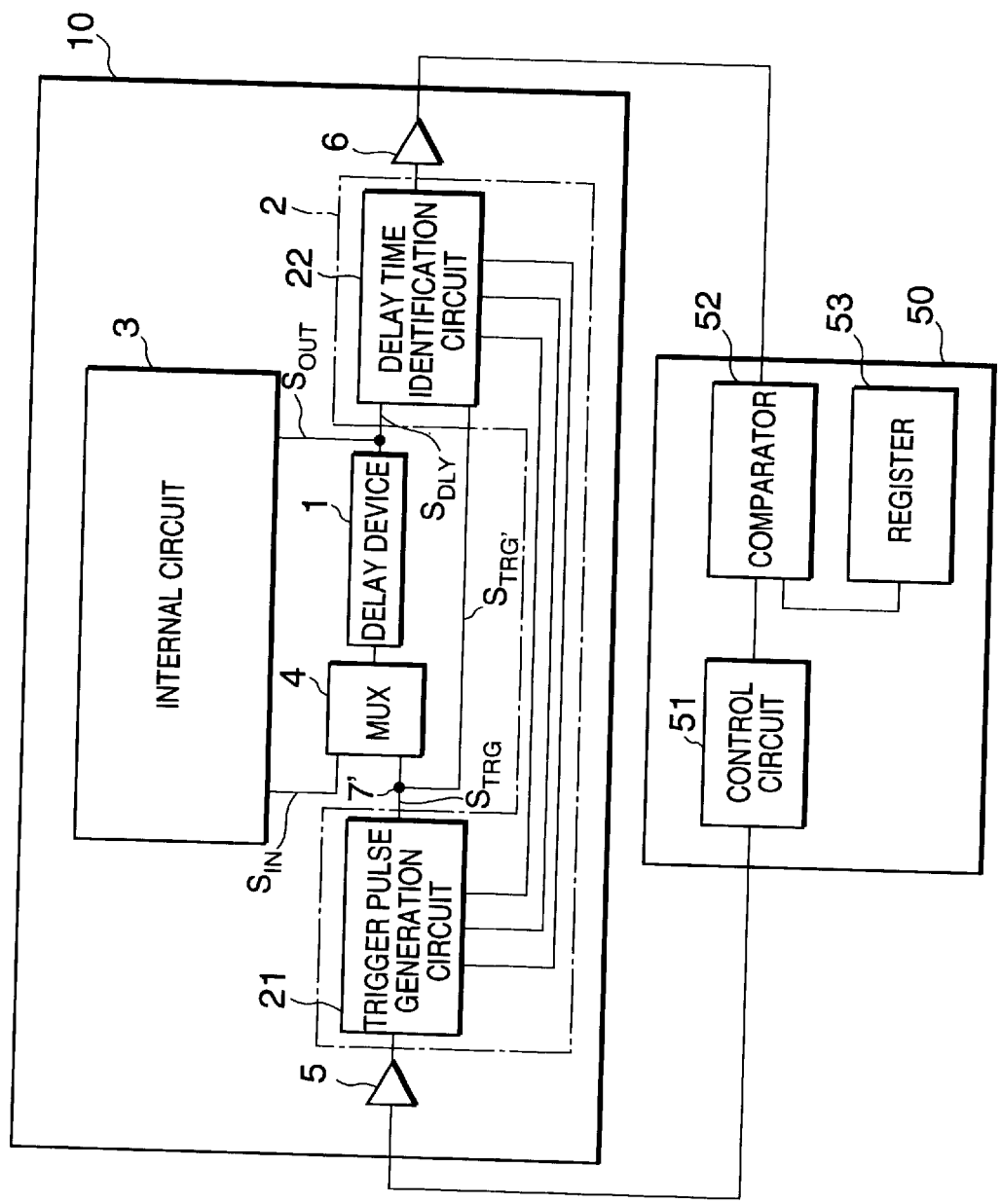
FIG. 6 shows a further configuration of the semiconductor device according to the first embodiment of the present invention.

According to the present embodiment, as shown in FIG. 6, the node 7 for distributing the test trigger signal STRG to the delay device 1 and the delay time identification circuit 22 can be provided between the multiplexer 4 and the trigger pulse generation circuit 21. The node 7 provided between the multiplexer 4 and the trigger pulse generation circuit 21 is described as node 7' in FIG. 6. The node 7' distributes the test trigger signal STRG to the multiplexer 4 and the delay time identification circuit 22. The test trigger signal STRG distributed to the delay time identification circuit 22 is described as a test trigger signal STRG' in FIG. 6.

At this time, the test output signal SDLY is obtained by delaying the test trigger signal STRG' by the delay time occurring in the multiplexer 4 and the delay device 1. Furthermore, the output signal SOUT generated in the normal operation mode is obtained by delaying the input signal SIN by the delay time occurring in the multiplexer 4 and the delay device 1. By providing the node 7 between the multiplexer 4 and the trigger pulse generation circuit 21, the delay time measurement circuit 2 measures the delay time occurring in the multiplexer 4 and the delay device 1. The delay time occurring in the multiplexer 4 and the delay device 1 is a delay time truly relating to the operation of the multiplexer 4. It may be desired to measure the delay time.

Figure 7:
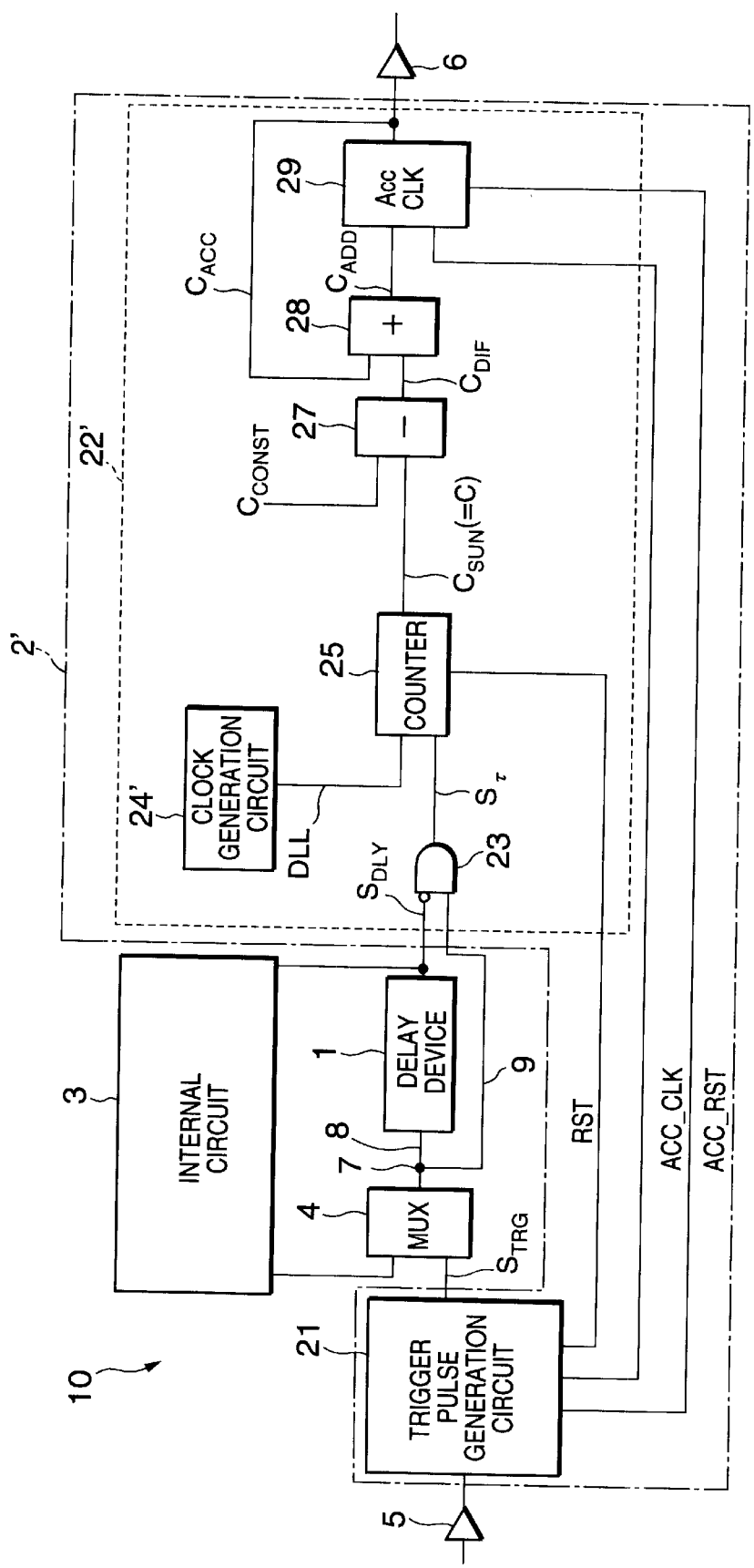
FIG. 7 shows the configuration of the semiconductor device according to the second embodiment of the present invention.

The semiconductor device according to the second embodiment has substantially the same configuration as the semiconductor device according to the first embodiment. The semiconductor device according to the second embodiment has the configuration in which the delay time identification circuit 22 loaded into the semiconductor chip 10 of the semiconductor device according to the first embodiment is replaced with the delay time identification circuit 22' shown in FIG. 7. Otherwise, the configuration of the semiconductor device according to the second embodiment is the same as that according to the first embodiment.

The delay time identification circuit 22' of the semiconductor device according to the second embodiment is different in the number of counters from the delay time identification circuit 22 of the semiconductor device according to the first embodiment. As described above, the delay time identification circuit 22 includes 16 counters 251 to 2516. The delay time identification circuit 22' includes one counter 25, and the clock generation circuit 24 is replaced with the clock generation circuit 24' for generating one clock signal DLL. Furthermore, any portion corresponding to the first adder 26 for obtaining a sum of the counter values C1 to C16 is not provided in the delay time identification circuit 22'. The counter value C held by the counter 25 is a counter value sum CSUM as is. The configurations and the operations of other portions of the delay time identification circuit 22' are the same as those of the delay time identification circuit 22.

Figure 8:
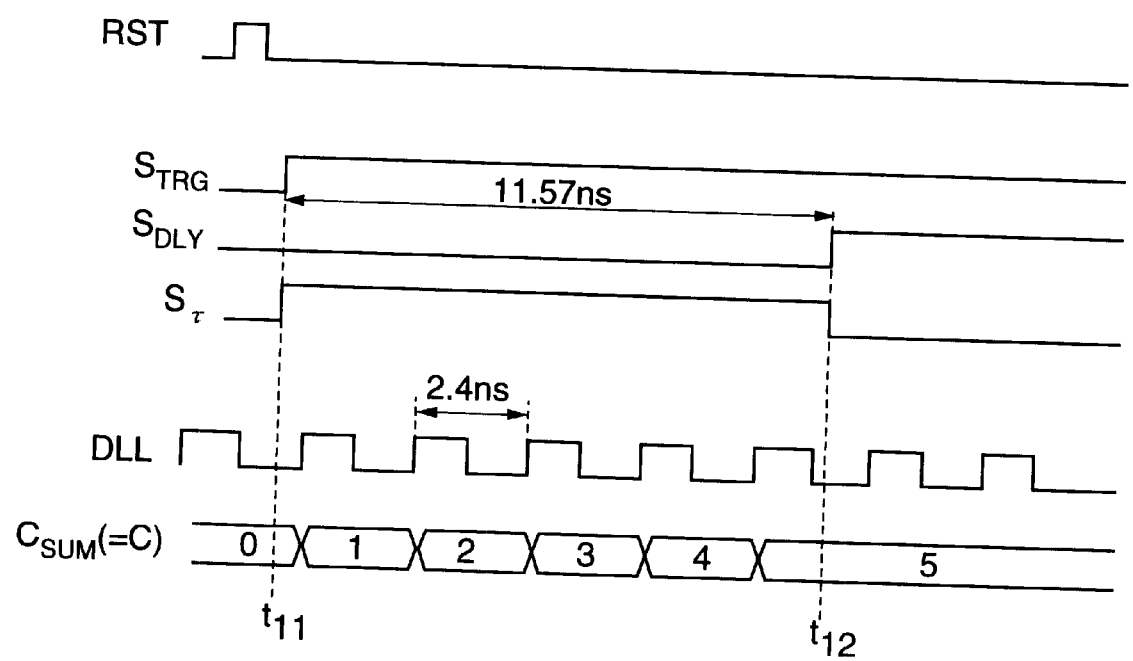
FIG. 8 shows the configuration of a delay time identification circuit 22'.
Figure 9:
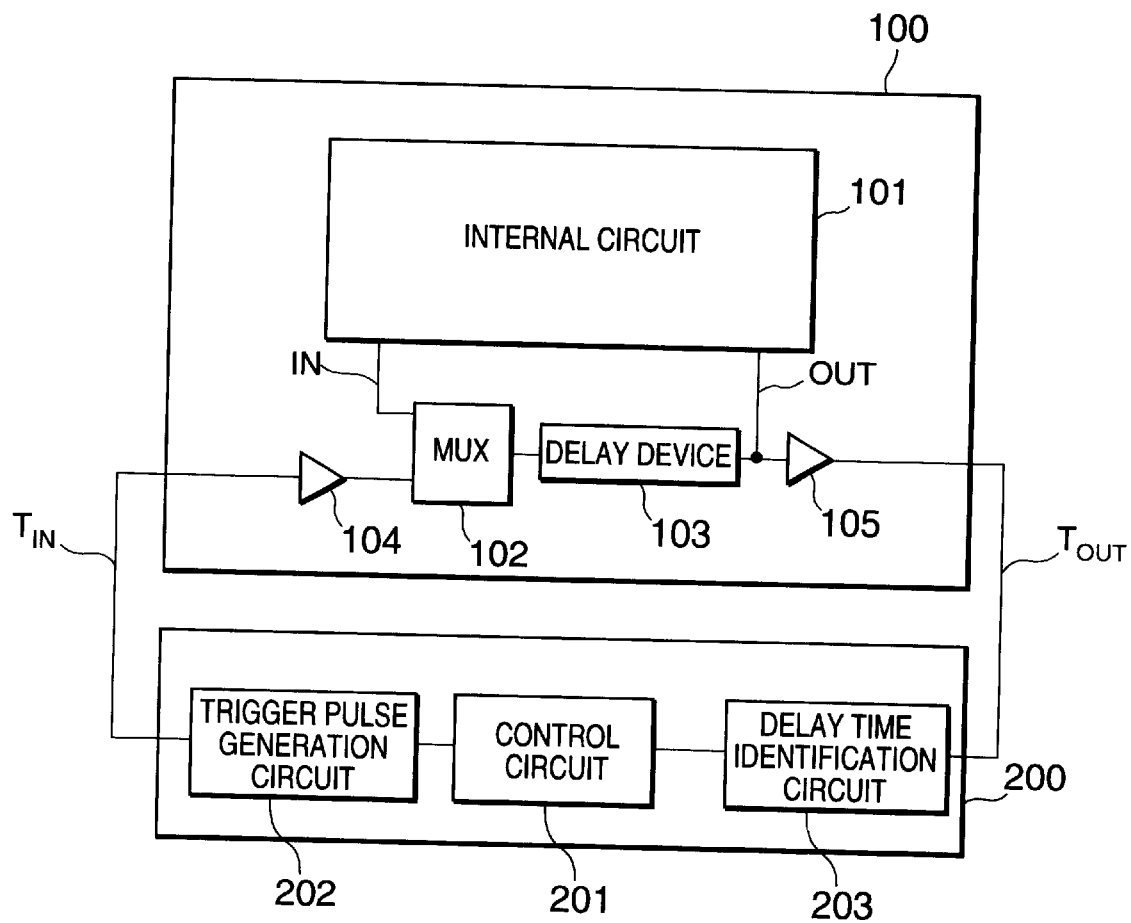
FIG. 9 shows the conventional semiconductor device.

FIG. 8 shows the operation of the delay time identification circuit 22'. In the second embodiment, the period T' of the clock signal DLL is assumed to be 2.4 ns. First, the reset signal RST is set at the H level, and the counter value C held by the counter 25 is set to 0. Then, the trigger pulse generation circuit 21 changes the test trigger signal STRG from the L level to the H level at the time t11. At the time t11, the delay time signal Sτ is also changed into the H level.

While the delay time signal Sτ is set at the H level, the counter value C held by the counter 25 is increased by 1 each time the clock signal DLL enters the H level from the L level. The counter value C can be increased up to 5.

When the test trigger signal STRG enters the H level from the L level, and the time t12 is reached after the delay time tDLY occurring in the delay device 1, the test output signal SDLY enters the H level. The delay time signal Sτ changes from the H level to the L level at the time t12. The counter value C stops increasing. The counter value C held at this time is output to the subtracter 27 as the counter value sum CSUM.

The difference CDIF is computed each time the delay time of the delay device 1 is measured. The computed difference CDIF is added by the second adder 28. The sum of the computed differences CDIF is accumulated as the accumulation value CACC by the accumulator 291.

The semiconductor device according to the second embodiment is preferable because it has a simpler configuration than the semiconductor device according to the first embodiment. However, the semiconductor device according to the first embodiment provided with the plurality of counters 251 to 2516 is preferable than the semiconductor device according to the second embodiment because it has a higher resolution of the measurement of a delay time. The resolution of the measurement of the delay time of the delay device 1 in the semiconductor device according to the first embodiment provided with a plurality of counters is represented by T/n where n indicates the number of counters, and T indicates the period of the clock signal. Thus, higher resolution can be realized.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device, comprising:
   a semiconductor chip comprising a delay unit having a delay time, and a delay time measuring unit for measuring the delay time, wherein
   said delay time measuring unit generates a measurement result signal, which is a digital signal, based on the delay time, and outputs the measurement result signal outside the semiconductor chip, wherein said delay time measuring unit comprises:
      a trigger pulse generation circuit for inputting an input trigger pulse into said delay unit for delaying the input trigger pulse by the delay time and outputting an output trigger pulse;
      a counter group circuit for receiving n clock signals having different phases, holding n counter values, and changing an i-th counter value in the n counter values in response to an i-th clock signal (i indicates any natural number equal to or smaller than n) in the n clock signals since the input trigger pulse is input into said delay unit until the output trigger pulse is output from said delay unit; and
      a measurement result signal generation unit for generating the measurement result signal based on the counter value.

2. The semiconductor device according to claim 1, wherein
   said counter group circuit comprises n counters in which an i-th counter (i indicates any natural number equal to or smaller than n) holds the i-th counter value, and simply changes the i-th counter value in response to the i-th clock signal (i indicates any natural number equal to or smaller than n).

3. The semiconductor device according to claim 1, wherein:
   said measurement result signal generation unit comprises:
      a first adder for computing a counter value sum which is a sum of counter values;
      an accumulation value holding unit for holding an accumulation value and outputting the measurement result signal based on the accumulation value; and
      a second adder for computing a sum by adding up the accumulation value and the counter value sum;
   said trigger pulse generation circuit outputs a timing indication pulse to said accumulation value holding unit after inputting the input trigger pulse into said delay unit; and
   said accumulation value holding unit fetches the sum at timing indicated by the timing indication pulse, and stores the sum as the accumulation value.

4. The semiconductor device according to claim 1, wherein
   said measurement result signal generation unit comprises:
      a first adder for computing a counter value sum which is a sum of counter values;
      a substracter for computing a difference by subtracting a predetermined value from the counter value sum; and a difference reference measurement result signal generation unit for generating the measurement result signal based on the difference.

5. The semiconductor device according to claim 4, wherein said difference reference measurement result signal generation unit comprises:

an accumulation value holding unit for holding an accumulation value and outputting the measurement result signal based on the accumulation value; and a second adder for computing a sum by adding up the accumulation value and the difference;

said trigger pulse generation circuit outputs a timing indication pulse to said accumulation value holding unit after inputting the input trigger pulse into said delay unit; and said accumulation value holding unit fetches the sum at timing indicated by the timing indication pulse, and stores the sum as the accumulation value.

\* \* \* \* \*